United States Patent [19]

Savelainen

[11] Patent Number: 4,654,596

[45] Date of Patent: Mar. 31, 1987

[54] COIL ARRANGEMENT FOR NMR EXAMINATION APPARATUS

[75] Inventor: Matti Savelainen, Espoo, Finland

[73] Assignee: Instrumentarium Corp., Finland

[21] Appl. No.: 611,110

[22] Filed: May 17, 1984

[30] Foreign Application Priority Data

May 20, 1983 [FI] Finland ................................ 831816

[51] Int. Cl.$^4$ .......................................... G01R 33/20
[52] U.S. Cl. ..................................... 324/320; 324/319
[58] Field of Search ............... 324/300, 307, 309, 318, 324/319, 320, 322

[56] References Cited

U.S. PATENT DOCUMENTS 4,456,881  6/1984  Compton .............................. 324/319
4,500,860  2/1985  Vermilyea ............................ 324/320

Primary Examiner—Michael J. Tokar
Attorney, Agent, or Firm—Andrus, Sceales, Starke & Sawall

[57] ABSTRACT

The invention is directed to a coil arrangement for an NMR examination apparatus, comprising a solenoid type of coil assembly (1, 3) for producing a homogeneous basic magnetic field, fitted inside it, a high-frequency coil (5) for transmitting radio-frequency pulses and for receiving NMR-signals generated in a target to be examined, a magnetic field gradient coil assembly (9) comprising one or a plurality of coils. In order to eliminate the relative disturbance effect of coils and to optimize the size of an assembly, a former (2) of said coil arrangement for producing said basic magnetic field is made of a material at least substantially not conducting electricity, e.g. of fiberglass-reinforced epoxy, at least on those parts of the coil arrangement that are near the part to be examined of a target, and said high-frequency coil (5) is located immediately in the vicinity of said coil former (2).

3 Claims, 1 Drawing Figure

COIL ARRANGEMENT FOR NMR EXAMINATION APPARATUS

The present invention relates to a coil arrangement of an NMR examination apparatus.

BACKGROUND OF THE INVENTION

It is well-known that a magnetic field can be produced by employing various types of basic geometries, such as the Helmholz coil or the double Helmholz coil (Katsuji Kaminishi, Rev. Sci. Instrum. 52 (3) March 1981) or a solenoid compensated at its ends (Garrett, Journal of Applied Physics, vol. 40 p. 3171, July 1969) or separate solenoids. Generally, the manufacturing costs of such a coil arrangement are considered proportional to the product of power P spent as resistance losses in coils and a winding mass m, fulfilling the equation:

$$Pm = kd^4 \cdot B^2,$$

wherein k is a proportionally factor depending on a selected geometry and winding material, d is a dimension describing the size of a magnet, primarily its diameter, and B is a produced field. It can be seen that the costs depend very much on the size of an apparatus. Thus, in view of the costs, it is preferable to make a magnetic coil as small as possible as long as it is considered that samples to be analysed or a target to be examined must be fitted inside a coil arrangement. On the other hand, it must be considered that eddy currents generated on the conductive surfaces of a coil arrangement producing a homogeneous basic magnetic field, especially in the body portions of a coil arrangement, disturb the operation of a radiofrequency transmitter-receiver coil or a so-called rf-coil as well as gradient coils. A result of this has been a necessity to make the basic coil arrangement 20...30% larger than an rf-coil and gradient coils which in practice has meant that the price of a coil arrangement has doubled or tripled.

SUMMARY OF THE INVENTION

An object of the invention is to eliminate the above drawbacks involved in the prior art and to provide a coil arrangement for an NMR examination apparatus which is as small as possible and economic in terms of costs, all the time considered a target to be examined. This object of the invention is achieved in that the coil former of a coil arrangement for producing said basic magnetic field is made of a material at least substantially not conducting electricity at least on those parts of a coil assembly which are near the part to be examined of a target, and that said high-frequency coil is arranged immediately in the vicinity of said coil former. Although the winding of a coil assembly producing a basic magnetic field is also, in the solution of the invention, located near an rf-coil and gradient coils, there will be practically no eddy currents undesired in terms of said coils, since said winding and these coils lie in orthogonal directions to each other. Thus, amongst the advantages gained by an arrangement of the invention are as small a size as possible and a low power consumption for an arrangement and further relatively low costs. If aluminium is used as winding material, the assembly will be even lighter. Aluminium is also very suitable to be placed on top of a coil former having well insulated thermal expansion.

The invention can be especially well applied in an assembly wherein a homogeneous basic magnetic field is produced by a solenoid coil arrangement, comprising a solenoid of substantial width in the direction of solenoid axis and separate magnetic field correction solenoids fitted symmetrically on either side of the first-mentioned solenoid. Thus, the latter solenoids can, if desired, be made of an electricity conducting material for their former structures, which may be preferable in view of e.g. cooling of a coil arrangement.

DESCRIPTION OF THE DRAWINGS

The only FIGURE of the accompanying drawing shows a principle view of one coil arrangement solution of the invention, comprising three separate solenoids and described in more detail hereinbelow.

DESCRIPTION OF THE PREFERRED EMBODIMENT

Figure 1:
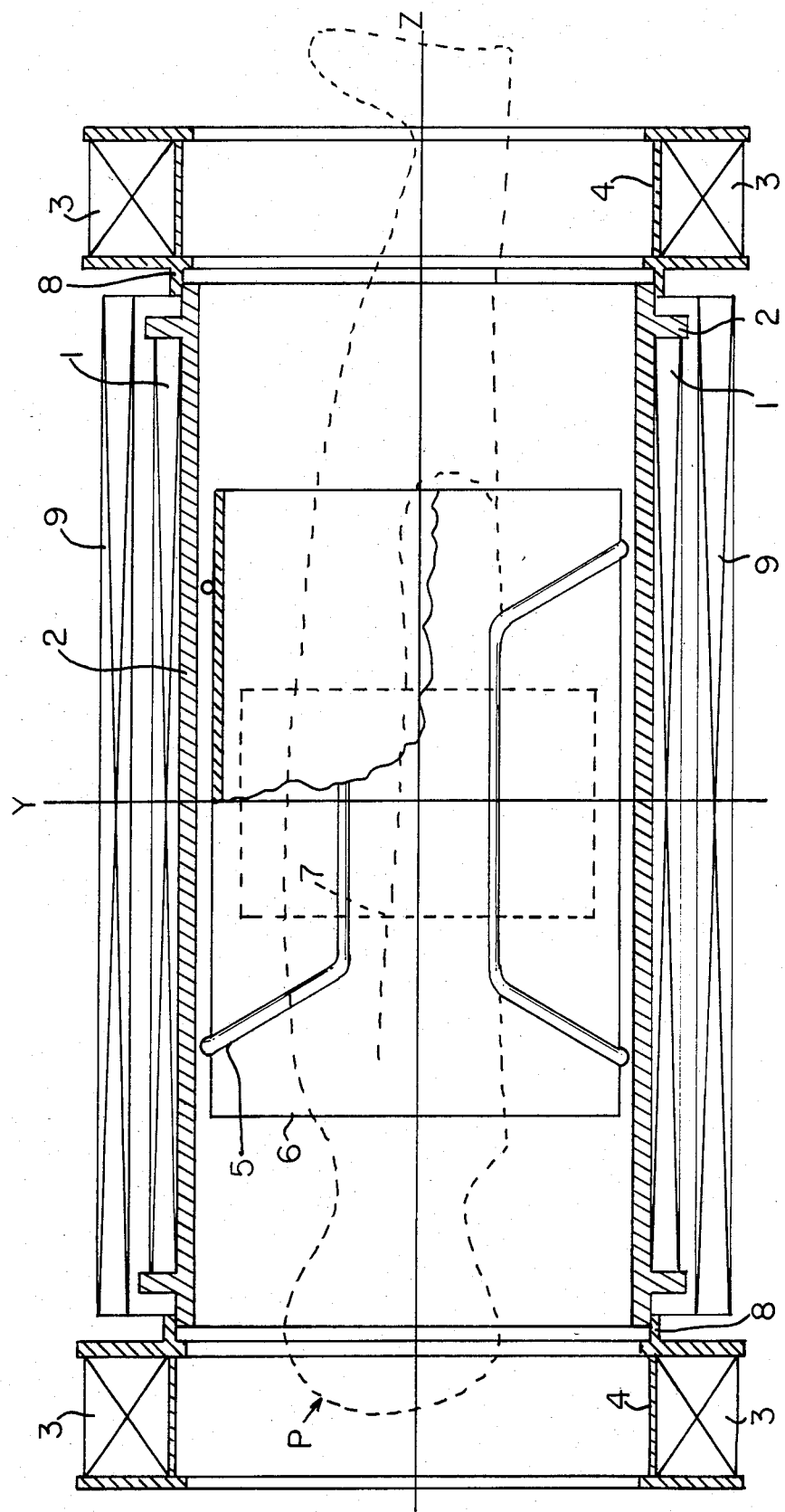

In the drawing, reference numeral 1 designates the middlemost one of the solenoid type coils for producing a homogeneous basic magnetic field and reference numeral 3 refers to correction coils, fitted symmetrically on either side of coil 1 and whose purpose is to facilitate the achievement of high degree of homogeneity for a magnetic field on at least one imaging area 7 of the assembly, the size of said area being adjustable as need be. The former structures of coils 1 and 3 are respectively designated by reference numerals 2 and 4.

Inside the above-mentioned basic coil is fitted a high-frequency coil 5 with its former structure 6. This coil 5 is used to transmit radiofrequency pulses to spots selected in a per se known manner in imaging area 7 for producing NMR signals from an imaging target P, which can be e.g. a patient. At the same time, this coil 5 serves as a receiver of produced NMR signals. The assembly further includes 1 ... 3 gradient coils 9 for producing mutually orthogonal magnetic fields in the basic magnetic field generated by coils 1 and 3. Depending on a choice, said gradient coils 9 can also be fitted inside coils 1 and 3.

According to the invention, by producing the former 2 of coil 1 of some non-conductive material, e.g. of fiberglass-reinforced epoxy, said high-frequency coil 5 and gradient coils 9 can be positioned near coil 1 without producing undesired, operation disturbing eddy currents. Thus, the entire NMR examination apparatus can be made relatively small or compact, which is of essential significance in terms of the manufacturing costs of an assembly.

In practice, coils 3 are at such a distance from high-frequency coil 5 and gradient coils 9 that their former material need not be made of a non-conductive material. Neither is the actual winding portion of coil 1 particularly significant in terms of said eddy currents, as the winding extends orthogonally to said coils 5 and 9. Coils 3 are preferably connected to coil 1 by means of an axial displacement permitting joint 8, since then these coils can be shifted axially relative to each other and this way regulate and effect on the homogeneity of a basic magnetic field for optimum results.

The invention is by no means limited to the above-described embodiment but a plurality of modifications are conceivable within the scope of the annexed claims.

What is claimed is:

1. A coil arrangement for NMR apparatus for examining an object, said coil arrangement comprising:

a first coil assembly for producing a basic magnetic field for the NMR apparatus, said assembly having a magnetic coil of the solenoid type formed on a coil former, said coil former being made of substantially electrically non-conductive material, at least in the portions thereof located adjacent to the part of the object undergoing examination, said first coil assembly having a substantial dimension in a direction parallel to the solenoid axis of said magnetic coil, said first coil assembly including correction solenoids at either end of said magnetic coil and electrically non-conductive coil former, said correction solenoids having a smaller dimension than said magnetic coil in a direction parallel to the solenoid axis, said correction solenoids having coil formers formed out of electrically conductive material;

a second coil assembly for providing magnetic field gradients in said basic magnetic field; and a high frequency coil arranged in proximity to said coil former for transmitting radio frequency pulses and for receiving NMR signals generated in the object undergoing examination.

2. A coil arrangement as claimed in claim 1 wherein said coil former of said first coil assembly is formed of glass fiber reinforced plastic.

3. A coil arrangement as claimed in claim 1 wherein said magnetic coil of said first coil assembly is wound from an aluminum conductor.

* * * * *